(12) United States Patent
Pelouard et al.

(10) Patent No.: US 9,406,819 B2
(45) Date of Patent: Aug. 2, 2016

(54) PHOTOVOLTAIC COMPONENT WITH A HIGH CONVERSION EFFICIENCY

(71) Applicants: Centre National de la Recherche Scientifique—CNRS, Paris (FR); ELECTRICITÉ DE FRANCE—EDF, Paris (FR); UNIVERSITE PIERRE ET MARIE CURIE—PARIS 6, Paris (FR)

(72) Inventors: Jean-Luc Pelouard, Paris (FR); Jean-François Guillemoles, Paris (FR); Florian Proise, Paris (FR); Myriam Paire, Paris (FR); Daniel Lincot, Antony (FR)

(73) Assignees: Centre National de la Recherche Scientifique—CNRS, Paris (FR); ELECTRICITÉ DE FRANCE—EDF, Paris (FR); UNIVERSITE PIERRE ET MARIE CURIE—PARIS 6, Paris (FR)

(*) Notice: Subject to any disclaimer, the term of this patent is extended or adjusted under 35 U.S.C. 154(b) by 0 days.

(21) Appl. No.: 14/431,804

(22) PCT Filed: Sep. 27, 2013

(86) PCT No.: PCT/EP2013/070286
§ 371 (c)(1),
(2) Date: Mar. 27, 2015

(87) PCT Pub. No.: WO2014/049157
PCT Pub. Date: Apr. 3, 2014

(65) Prior Publication Data
US 2015/0255639 A1  Sep. 10, 2015

(30) Foreign Application Priority Data

Sep. 28, 2012 (FR) ...................... 12 59225

(51) Int. Cl.
*H01L 31/0232* (2014.01)
*H01L 31/0352* (2006.01)
(Continued)

(52) U.S. Cl.
CPC ........ *H01L 31/02327* (2013.01); *H01L 27/142* (2013.01); *H01L 31/0203* (2013.01); *H01L 31/035209* (2013.01); *H01L 31/0475* (2014.12);
(Continued)

(58) Field of Classification Search
CPC .............. H01L 31/02327; H01L 31/035209; H01L 31/055; H01L 31/0475; H01L 31/0203; H01L 31/186; H01L 31/142; H01L 31/108
USPC ......................................... 136/257
See application file for complete search history.

(56) References Cited

U.S. PATENT DOCUMENTS

2006/0151807 A1* 7/2006 Pardo ................. H01L 31/0232
257/184
2013/0092311 A1* 4/2013 Kobayashi ................ F17C 1/06
156/64

FOREIGN PATENT DOCUMENTS

WO  WO 2011/131586  * 10/2011

*Primary Examiner* — Jayne Mershon
(74) *Attorney, Agent, or Firm* — Osha Liang LLP

(57) ABSTRACT

A photovoltaic component that includes at least one first array of photovoltaic nano-cells is disclosed. Each photovoltaic component includes an optical nano-antenna exhibiting an electromagnetic resonance in a first resonant spectral band, at least one lateral dimension of the optical nano-antenna being subwavelength in size, and a spectral conversion layer allowing at least part of the solar spectrum to be converted to said first resonant spectral band.

16 Claims, 10 Drawing Sheets

(51) Int. Cl.
*H01L 31/055* (2014.01)
*H01L 31/0475* (2014.01)
*H01L 31/0203* (2014.01)
*H01L 31/18* (2006.01)
*H01L 27/142* (2014.01)
*H01L 31/108* (2006.01)

(52) U.S. Cl.
CPC ............ *H01L 31/055* (2013.01); *H01L 31/108* (2013.01); *H01L 31/186* (2013.01); *Y02E 10/52* (2013.01)

PHOTOVOLTAIC COMPONENT WITH A HIGH CONVERSION EFFICIENCY

TECHNICAL FIELD OF THE INVENTION

The present invention relates to a photovoltaic component with an improved conversion efficiency and to its manufacturing process.

PRIOR ART

It has been demonstrated that the conversion efficiency of solar cells increases with the intensity of the incident light flux, providing that Joule losses resulting from electrical voltage drops in resistive zones of the cell remain small (see for example M. Paire et al., "Microscale solar cells for high concentration on polycrystalline Cu(In, Ga)Se$_2$ thin films", Appl. Phys. Letts. 98, 264102 (2011)). It is demonstrated in the article by M. Paire et al. that it is possible with cells of small diameter (from 10 to 500 microns) to achieve high concentration ratios (up to 475), the concentration ratio being defined as the ratio of the flux of photons entering into the cell to the incident flux measured in the far field, while simultaneously limiting resistive losses. This especially allowed conversion efficiency, defined as the ratio of the electrical power produced to the incident optical power, to be increased by 5 points. Concentration of the incident light flux also makes it possible to reduce consumption of raw materials with high production costs, the area of the semiconductor required to produce the cells being reduced by a factor equal to the concentration factor. This is particularly important for thin-film-based cells, especially chalcopyrite-based cells, because of the limited long-term availability of indium and tellurium.

However, solar light cannot be concentrated on a photovoltaic cell without difficulties. Solar light arrives on Earth at sea level in two forms, direct and scattered light. Direct light (rays originating from the Sun) may be concentrated by an imaging optical system. The latter, in order to remain effective, must precisely follow the apparent movement of the Sun throughout the day. Scattered light (scattered by the atmosphere) is, for its part, lost in these imaging systems. Non-imaging systems exist that allow scattered light to be concentrated (see for example T. Warabizaco et al., "Static concentrator module with prism array", Solar Energy Materials and Solar Cells, 67, 415-423 (2001) or R. Winston et al., "Nonimaging optics", Elsevier Academic Press (2005)), but their concentration factor remains modest (i.e. lower than 4).

One known type of non-imaging light-concentrating system is the fluorescent concentrator (R. Reisfeld et al., "Luminescent Solar Concentrators for Energy Conversion", Solar Energy Materials, 49, 1 (1982)). It functions as a cavity collecting solar light over a large area in order to guide it towards a smaller zone in which a (or more than one) photovoltaic cell(s) is (are) positioned. This system has the advantage of collecting light from the Sun for all angles of incidence, and therefore of benefiting from both the direct and scattered components of the solar light. Thus, no system for precisely following the Sun is necessary. In contrast, this system introduces a number of losses, in particular losses due to multiple reflections in the waveguide. Therefore, the concentration factors obtained remain very low.

Optical nano-antennae of the (metal/insulator/metal) MIM type have demonstrated remarkable capabilities in terms of the collection of light in very small volumes. Specifically, they may exhibit, at resonance, almost perfect absorption, independently of angle of incidence, over a very wide angular range (typically between −70 and +70 degrees) and cavity volumes as small as $\lambda^3/1000$ (A. Cattoni et al., "$\lambda^3/1000$ plasmonic nanocavities for biosensing fabricated by Soft UV Nanoimprint Lithography", Nano Lett. 11(9) 3557 (2011)). The resonant character of these antennae, due to the confinement in an optical cavity of coupled plasmonic modes propagating at the metal/dielectric interfaces, means that their spectral width is very small relative to that of the solar spectrum (typically they have a full width at half-maximum of less than a tenth of the resonant wavelength). Asymmetric MIM structures dedicated to the production of photovoltaic cells have been reported in published French patent application FR 2 959 352. They are based on the simultaneous presence of a plurality of resonances allowing a large part of the solar spectrum to be covered. Although very efficient, the dimensions of these structures are highly constrained due to the conditions that must be met to obtain multi-resonance in the solar spectrum with a given semiconductor.

One objective of the present invention is to produce a photovoltaic component with concentration using optical nano-antennae, for example of the MIM type, having, relative to existing photovoltaic components, an improved conversion efficiency and consuming less of the materials required for the photovoltaic function.

SUMMARY OF THE INVENTION

According to a first aspect, the invention relates to a photovoltaic component comprising at least one first array of photovoltaic nano-cells each comprising an optical nano-antenna exhibiting an electromagnetic resonance in a first resonant spectral band, at least one lateral dimension of the optical nano-antenna being subwavelength in size, i.e. smaller in size than a central wavelength of said first resonant spectral band; and a spectral conversion layer allowing at least part of the solar spectrum to be converted to said first resonant spectral band.

The photovoltaic component according to the present description creates a synergy between a spatial concentrator (the optical nano-antennae) and a spectral concentrator (the spectral conversion layer) in such a way as to enable an optimized amount of absorption of incident photons by the photovoltaic component. The spectral conversion layer especially allows the optical nano-antennae to be used in a single-resonance electromagnetic resonator operating mode, thereby allowing almost total absorption to be obtained in the resonant spectral band, and thus an excellent conversion efficiency for the photovoltaic component.

As a variant, the photovoltaic component comprises a continuous first metal layer and each photovoltaic nano-cell comprises a structured multilayer of a first dielectric layer and of a second metal layer to form, with the continuous first metal layer, an optical nano-antenna of MIM (for metal/insulator/metal) type. This particular configuration of the photovoltaic component allows the MIM nano-antennae to be designed with an arrangement that has an excellent capacity to concentrate incident light flux.

The so-called "MIM" type structures comprise a first metal layer and a structured multilayer of a first dielectric layer and of a second metal layer.

In electromagnetism, a dielectric is a medium for wave propagation, and particularly light propagation. Propagation medium is defined, at a given wavelength, by a dielectric constant as the square of the refractive index. In the case where the propagation medium presents losses (absorption), dielectric constant and refractive index become complex numbers. A dielectric material has a refractive index with a dominant real part unlike a metal wherein the imaginary part dominates. Except for energies photons above the band gap, semiconductors are low-loss dielectric media. At optical frequencies, when free electrical charges are generated by doping or illumination, the dielectric constant of the semiconductor doesn't vary significantly (less than one per thousand). At optical frequencies, a semi-conductive material is a dielectric material.

Thereby, the dielectric part of the MIM resonators can comprise, as a variant, a multilayer adapted to the production of a photovoltaic device, for example a multilayer of organic, inorganic or hybrid semiconductor layers. The multilayer of semiconductor layers for example comprises a layer made of a semiconductor that is absorbent in said first resonant spectral band, and, on either side of the layer made of the absorbent semiconductor, a layer or a multilayer made of a doped semiconductor making contact with the first and second metal layers, respectively. The layer or multilayer of the doped semiconductor making contact with the structured second metal layer contributes to forming an electrical contact to the photovoltaic nano-cells.

As a variant, all the layers forming the dielectric part of the MIM resonators are structured. Alternatively, only the layer or multilayer made of the doped semiconductor ensuring the electrical contact with the second metal layer is structured.

The photovoltaic nano-cells may comprise inorganic semiconductors, for example layers made of gallium arsenide and associated alloys, of indium phosphide and associated alloys, of indium gallium arsenide and associated alloys, or of gallium antimonide and associated alloys. The photovoltaic nano-cells may also comprise organic or hybrid semiconductors.

As a variant, a lateral dimension of each optical MIM nano-antenna is smaller than $\lambda_0/5$ where $\lambda_0$ is a central wavelength of said first resonant spectral band, i.e. a wavelength in the resonant spectral band at which the absorption exhibits a maximum. By making the size of at least one lateral dimension smaller than $\lambda_0/5$, the vertical mode of the resonator is preserved while reducing dark currents, which are proportional to the area of the junction.

As a variant, the optical MIM nano-antennae take a strip form and are placed with a principle orientation. The second metal layers of at least some of the optical MIM nano-antennae may then be connected to form an upper electrical contact for the first array of photovoltaic nano-cells. As a variant, the optical MIM nano-antennae may be substantially identical and distributed periodically or quasi-periodically. Alternatively, the width of the strips may exhibit variations over a quasi-period shorter than the wavelength, for example taking the form of steps or bevels, in order to widen the spectral response and thus best match the absorption range of the resonator to that of the emission of the spectral converter.

Alternatively, the optical MIM nano-antennae may have a pad form (for example square-shaped) and be placed in two principal directions. The component may then furthermore comprise an electrically insulating and transparent encapsulation layer between the pads, and a transparent conductive layer making contact with the second metal layer of at least some of the optical nano-antennae in order to form an upper electrical contact for the first array of photovoltaic nano-cells.

As a variant, the spectral conversion layer comprises one or more spectral conversion materials hosted by a solid or liquid matrix. The spectral conversion materials for example comprise fluorescent or phosphorescent molecules or quantum dots. The nature of the matrix may be chosen depending on its thickness, for example organic polymers may be used for millimetre-sized thicknesses and resists may be used for micron-sized thicknesses.

As a variant, the spectral conversion layer comprises at least two spectral conversion materials, the absorption spectrum of the second material covering the effective emission spectrum of the first material, and the effective emission spectrum of the second material being at least partially superposed with said first resonant spectral band. Such an arrangement of spectral conversion materials enables "cascade" operation of the photovoltaic component, enabling photons emitted in a wider range of the solar spectrum to be absorbed with a single type of optical nano-antennae.

As a variant, the photovoltaic component comprises at least one first array of photovoltaic nano-cells each comprising an optical nano-antenna having a first resonant spectral band, and a second array of photovoltaic nano-cells each comprising an optical nano-antenna having a second resonant spectral band.

In this case, the spectral conversion layer may comprise a spectral conversion material allowing at least part of the solar spectrum to be converted to the first and second resonant spectral bands. In other words, two types of photovoltaic nano-antennae are used to absorb the photons emitted by a spectral conversion material, enabling better absorption of the entire spectral band of emission of the spectral conversion material.

Alternatively, the spectral conversion layer comprises at least two spectral conversion materials, each of said spectral conversion materials allowing at least part of the solar spectrum to be converted to each of said first and second resonant spectral bands. A "parallel" mode is then spoken of for the photovoltaic component, this mode also allowing the range of the solar spectrum useful to the photovoltaic device to be widened.

As a variant, the photovoltaic component furthermore comprises an array of photovoltaic nano-cells each comprising an optical nano-antenna the resonant spectral band of which is adapted for direct absorption of part of the solar spectrum.

According to a second aspect, the invention relates to a method for manufacturing a photovoltaic component according to the first aspect, comprising:
  depositing, on a metalized substrate, a multilayer of semiconductor layers one layer of which is absorbent in said first resonant spectral band;
  depositing a structured metal layer;
  self-aligned etching of at least some of said semiconductor layers; and
  depositing an encapsulation layer and an upper contact layer made of a transparent conductive material.

As a variant, the deposition step comprises growing by epitaxy on a suitable substrate said multilayer of semiconductor layers, and transferring said semiconductor layers to the metalized substrate.

BRIEF DESCRIPTION OF THE DRAWINGS

Other advantages and features of the invention will become apparent on reading the description, illustrated by the following figures.

DETAILED DESCRIPTION

Figure 1:
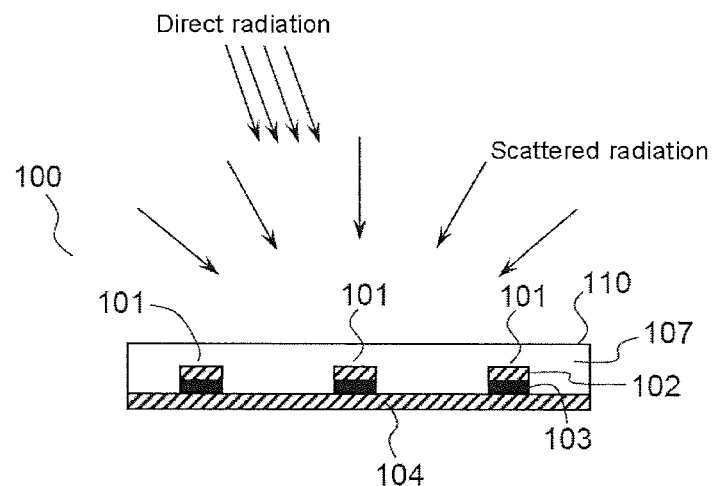
FIG. 1, a schematic illustrating the principal of an example photovoltaic component according to the invention.
Figure 2:
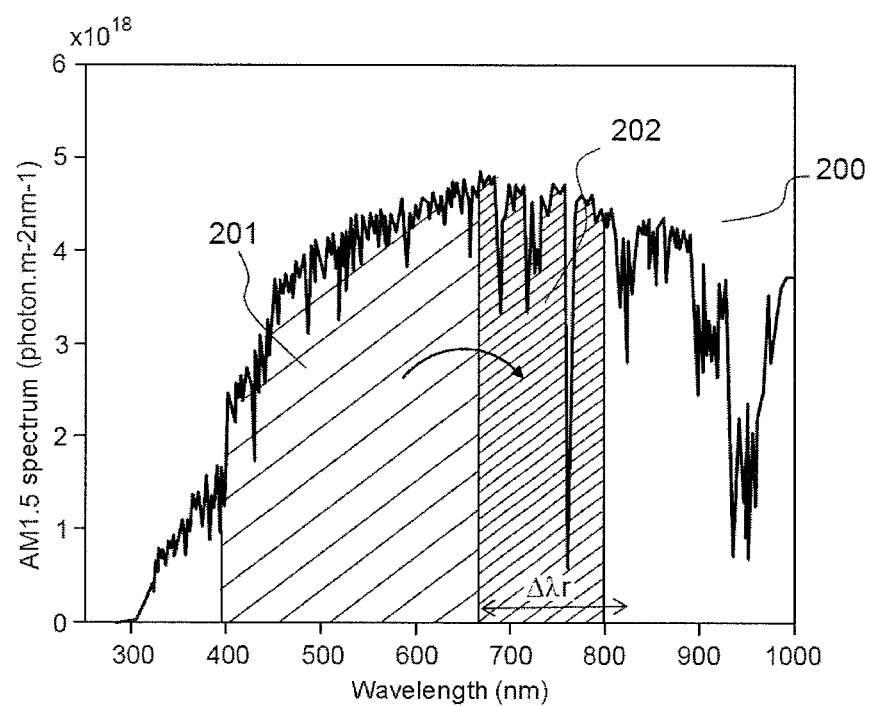
FIG. 2, a curve showing the solar spectrum, examples of spectral absorption and emission bands of a spectral conversion material and the absorption spectral band of an electromagnetic resonator adapted to the emission spectrum of the spectral conversion material being indicated on this curve.

FIGS. 1 and 2 illustrate, via a simplified schematic and a graph showing spectral absorption/emission bands superposed on the solar spectrum, respectively, the principle of the invention.

The photovoltaic component 100 schematically shown in FIG. 1 comprises, on its side intended to be exposed to the Sun, a spectral conversion layer 107 for converting all or some of the solar spectrum. The layer 107 comprises a spectral conversion material, for example a luminescent dye, allowing incident solar light to be absorbed and re-emitted isotropically in a spectral band shifted to longer wavelengths, and the width of which is much thinner than that of the solar radiation (typically a few tens to about a hundred nanometres in width). The spectral conversion layer therefore acts as a spectral concentrator. This spectral concentration is illustrated in FIG. 2, the curve 200 of which represents the solar spectrum (AM1.5 solar spectrum in units of numbers of photons/m²/nm). The hatched zone 201 illustrates the absorption band of the spectral conversion layer 107 corresponding to the absorption band of a spectral conversion material contained in the layer 107, for example a dye, and the hatched zone 202 illustrates the effective emission band of this material under an incident light flux. Spectral concentration of the light flux is observed because the spectral emission band is narrower than the spectral absorption band. It is moreover shifted to longer wavelengths.

The photovoltaic component 100 furthermore comprises an array of photovoltaic nano-cells 101 covered by the spectral conversion layer 107. Each photovoltaic nano-cell comprises an optical nano-antenna, having a resonant spectral band $\Delta\lambda_r$ especially defined by the geometry of the nano-antenna, and a photovoltaic device. When the design of the nano-antenna is optimized, it exhibits almost perfect absorption at the resonant wavelength and behaves like a mirror outside of the resonant spectral band. A general description of nano-antennae is given in the review article "Nanoantennas for visible and infrared radiation", Reports on Progress in Physics, 75 024402 (2012). Advantageously, as is illustrated in FIG. 1, the optical nano-antennae are metal/insulator/metal (MIM) electromagnetic resonators comprising a first metal layer 104, a semiconductor multilayer forming a dielectric layer 103, and a metal layer 102. In this example, the first metal layer 104 is continuous, common to all the MIM structures, and may form a common first electrical contact to the array of photovoltaic nano-cells. The layer 102 is structured to form, with the dielectric layer 103 and the metal layer 104, optical nano-antennae the dimensions of which are defined depending on the desired central resonant wavelength. The structured metal layer 102 contributes to forming the second electrical contact to each of the photovoltaic nano-cells. The multilayer of organic or inorganic semiconductors forming the dielectric layer 103 is chosen so that, with the electrical contacts 102, 104, a photovoltaic device allowing incident luminous power to be converted into electrical power is formed.

The optical nano-antennae are advantageously dimensioned in order to obtain maximal absorption in a spectral band $\Delta\lambda_r$ superposed on the spectral emission band (202, FIG. 2) of the spectral conversion material, such that all the photons emitted by the spectral conversion material may be used by the photovoltaic device. Since the effective area of the nano-antennae is much smaller (factor greater than 10) than their effective absorption cross section, each nano-antenna behaves as a spatial concentrator. Coupling the optical nano-antennae, which allow spatial concentration of the incident solar flux to be achieved, with the spectral conversion layer ensuring spectral concentration to the resonant band of the nano-antennae, allows the efficiency of the photovoltaic component to be considerably increased relative to the components described in the prior art.

Figure 3:
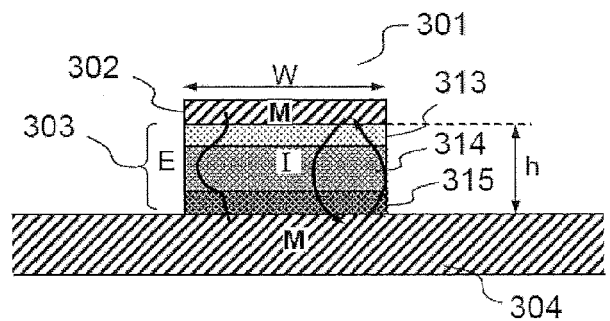
FIG. 3, a schematic illustrating a photovoltaic nano-cell comprising an optical MIM nano-antenna.

FIG. 3 illustrates in greater detail an example MIM resonator 301 adapted for a photovoltaic nano-cell of a photovoltaic component according to the invention.

As described above, the electromagnetic resonators, which are for example of the MIM type, play the role of a spatial concentrator of the light. Magneto-optical interference between the incident wave and evanescent waves created by the resonator allows, at resonance, via a funneling effect (F. Pardo et al., "Light funneling mechanism explained by magnetoelectric interference" Phys. Rev. Lett. 107 093902 (2011)), all the incident photons to be collected, over a distance close to the wavelength, and concentrated on the resonator. The resonator may thus have a volume as small as $\lambda^3/1000$ (see Cattoni et al. ibid), thereby illustrating the capacity of these nano-antennae to concentrate the incident light flux.

In the example in FIG. 3, the resonators 301 are formed from a first continuous metal layer 304 on which a structured multilayer, comprising a dielectric part 303 (I) and a metal part 302 (M), is deposited. The structuring may be carried out in one (1D) or two (2D) directions, in order to produce resonators taking the form of 1D strips or of rectangular or square 2D pads.

Resonators taking the form of strips have the advantage of being easier to connect electrically than pads. They may moreover be arranged to resonate under both TE and TM polarization components. Furthermore, the width of the strips will possibly contain variations (steps, bevels) having a quasi-period smaller than the wavelength in order to widen their spectral response and thus best match the absorption range of the resonator to that of the emission of the spectral converter.

The cavity thus formed exhibits, as is known, resonances of the Fabry-Perot type. Two different types of resonances are distinguished between: what are called horizontal modes (between the two vertical "mirrors" formed by the ends of the cavity) and what are called vertical modes (between the two horizontal "mirrors" formed by the metal layers). The resonant wavelength of the horizontal mode is set by the width W of the resonator (distance between the Fabry-Perot mirrors) and the resonant wavelength of the vertical mode is given by the thickness h of the dielectric layer 103 (distance between the metal layers 102, 104). Generally, these modes combine to form a hybrid mode, called a dot mode. As for any resonator of the Fabry-Perot type, there is at least one arrangement of the resonator, especially defined by the lateral dimensions and height of the structure and by the thicknesses of the layers, which allows, by balancing the incident flux and absorption inside the resonator, almost total absorption of the incident flux to be achieved at resonance. Coupling the spectral concentrator to the optical nano-antennae therefore makes it possible to use the optical nano-antennae in a single-resonance electromagnetic-resonator operating mode. Thus almost total absorption may be obtained in the resonant spectral band, which is not the case for multiple-resonance electromagnetic resonators in which optimization of the absorption over the entire solar spectrum may possibly be to the detriment of the absorption associated with a particular resonance The dielectric part (I) 303 of the MIM resonators 301 comprises a multilayer adapted to the production of a photovoltaic device. The metal layers (M) 302, 304 play, in addition to their electromagnetic role, that of the electrodes for the photovoltaic device. The multilayer 303 comprises at least one layer 314 made of a semiconductor that is absorbent in the resonant spectral band of the MIM resonator, for example the non-intentionally doped layer in a p-i-n junction. Depending on the nature of the photovoltaic device that it is desired to produce, one or more additional layers may be provided, for example semiconductor layers or interface layers, which, with the absorbent layer 314, will contribute to the photovoltaic function. In the example in FIG. 3, the layers 313, 315 are, for example, layers or multilayers of a highly doped semiconductor, making contact with the metal layers 302, 304, respectively, and ensuring a low electrical access resistance. The high doping level of these layers decreases, on the one hand, their electrical resistivity, and on the other hand, the specific resistance of the contact. These layers will possibly be chosen to be made of a transparent semiconductor in order to optimize the collection of photo-carriers. The nano-antennae are designed to concentrate the electric field in the dielectric part 303 of the MIM resonators, so as to minimize the electric field in the metal parts, and therefore to minimize absorption losses.

In the example in FIG. 3, all of the semiconductor layers forming the dielectric part I are structured in a similar way to the metal layer 302. Alternatively, it is possible to structure only the layer or multilayer made of a doped semiconductor 313 that forms the electrical contact with the metal layer 302.

As a variant, among the various possible optical modes of the MIM resonator, those best allowing the area of the junction to be decreased may be privileged in order to maximize the concentration factor of the incident flux. Specifically, since the effective cross section (collection area of the incident photons) of a square nano-antenna is approximately $\lambda^2$, the concentration ratio for a square nano-antenna of side length W is equal to $(\lambda/W)^2$. For example, vertical-mode MIM resonators will possibly be used, the height h of the dielectric multilayer 303 being set to $h=\lambda_0/2n_{eff}$, where $\lambda_0$ is the central resonant wavelength sought and $n_{eff}$ is the effective index of the mode in the resonator; it is similar to the refractive index of the dielectric multilayer. The width W of the MIM resonator, measured in the structured metal part (302), may then be set to its smallest possible value in order to preserve the vertical mode and decrease dark currents, which are proportional to the area of the junction. Typically, W will possibly be chosen to be smaller than or equal to $\lambda_0/5$, and for example to be about $\lambda_0/5$. In the particular case of a p-n junction photovoltaic device, made of gallium arsenide (GaAs) for example, having an operating wavelength of 0.9 μm and a refractive index of 3.5, the total height h of the dielectric multilayer 303 is about 140 nm for optimal operation. The operating wavelength is defined here as the wavelength at which peak absorption is observed, taking account both of the resonant spectral band associated with the geometry of the nano-antenna, and of the absorption spectrum of the absorbent semiconductor of the photovoltaic nano-cells. This thickness represents a reduction by about a factor of 10 relative to the best GaAs-based photovoltaic cells known in the literature, such as described, for example, in G. J Bauhuis et al., "26.1% thin-film GaAs solar cell using epitaxial lift-off" Solar Energy & Solar Cells 93 1488 (2009).

Reducing the thickness of the dielectric multilayer has two types of advantages over conventional photovoltaic cells such as defined, for example, in the reference cited above. Firstly, the operation of the cell and therefore its performance is improved. Specifically, reducing the thickness of the semiconductor layers results in a reduction in the average photo-carrier transit time. This results in a reduction in the recombination probability of the photo-carriers and therefore in an increase in the conversion efficiency of the cell. Combining a small thickness of semiconductor with the presence of metal electrodes making direct contact with the active zone also drastically decreases electrical access resistances, thereby allowing, by operating the cell under high concentration, the conversion efficiency of the cell to be increased. Moreover, reducing the thickness of the semiconductor layers, in association with their lateral structuring, leads to a drastic reduction in the semiconductor volume used with respect to a standard cell (a factor comprised between 100 and 1000). This reduction results in a double reduction in the cost of the cells: less material to be supplied and shorter manufacturing times. This advantage could prove to be crucial for semiconductors produced from rare-earth elements, such as indium in the CIGS system and tellurium in cadmium telluride (CdTe).

The role of the spectral conversion layer (107, FIG. 1) is on the one hand to absorb solar light over a wide spectral band, ideally as wide as the solar spectrum, and on the other hand to re-emit this light in a narrow spectrum, such that the absorption spectrum of the optical nano-antennae, such as described above, can be superposed, as best as possible, on the emission spectrum.

Various types of materials are suitable for producing the spectral conversion layer. By way of example, mention may be made of fluorescent molecules (rhodamine 6G, Lumogen RED 305® sold by BASF®), or phosphorescent molecules ($SrB_4O_7$ doped $Sm^{2+}$, and generally doped $RE^{2+}$, where RE denotes the rare earths) or even quantum dots, i.e. core/shell structures where the electronic states of the core are confined by the potential barrier of the shell, such as described for example in B. O. Dabbousi et al., "(CdSe)ZnS core-shell quantum dots: synthesis and characterization of a size series of highly luminescent nanocrystallites" J. Phys. Chem B. 101(46) 9463 (1997), or Liang Li et al., "Highly luminescent $CuInS_2$/ZnS core/shell nanocrystals: cadmium-free quantum dots for in vivo imaging" Chem. Matter. 21(12) 2422 (2009)).

Figure 4:
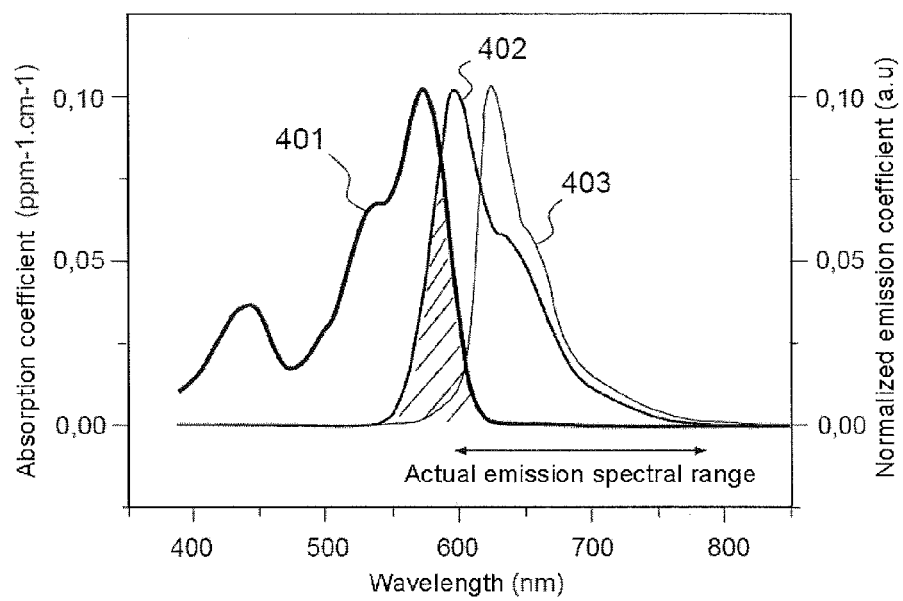
FIG. 4, curves showing the absorption and emission spectra of an example spectral conversion material for the spectral conversion layer.
Figure 5A:
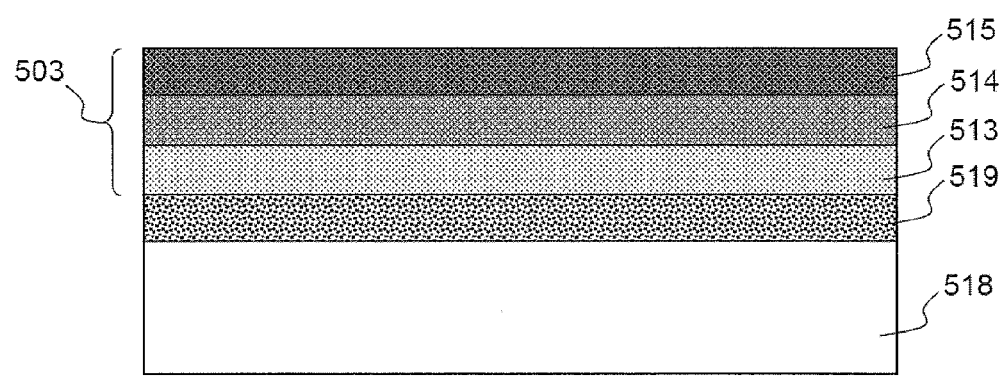
FIGS. 5A to 5G, schematics illustrating a process for manufacturing a photovoltaic component, in one embodiment.
Figure 5B:
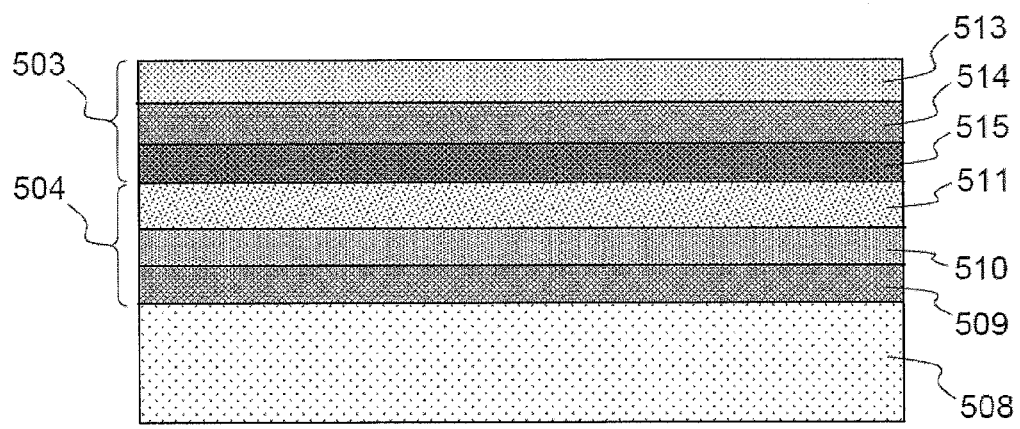
Figure 5C:
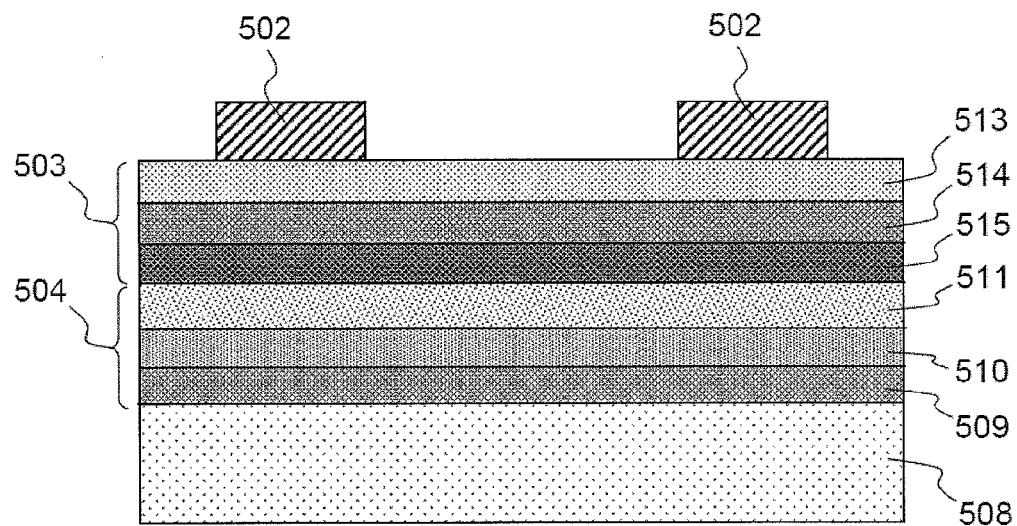
Figure 5D:
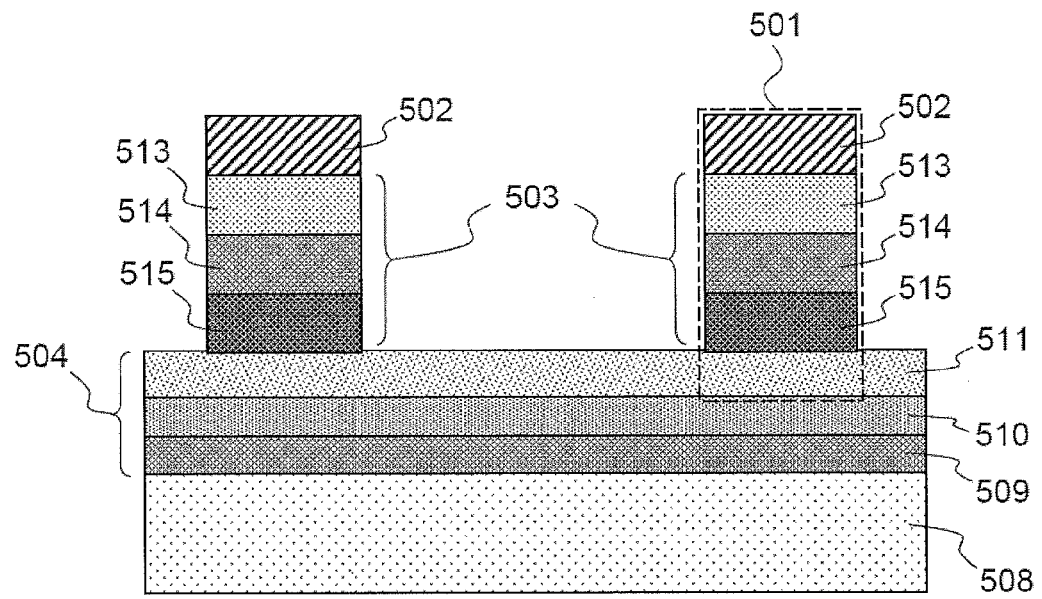
Figure 5E:
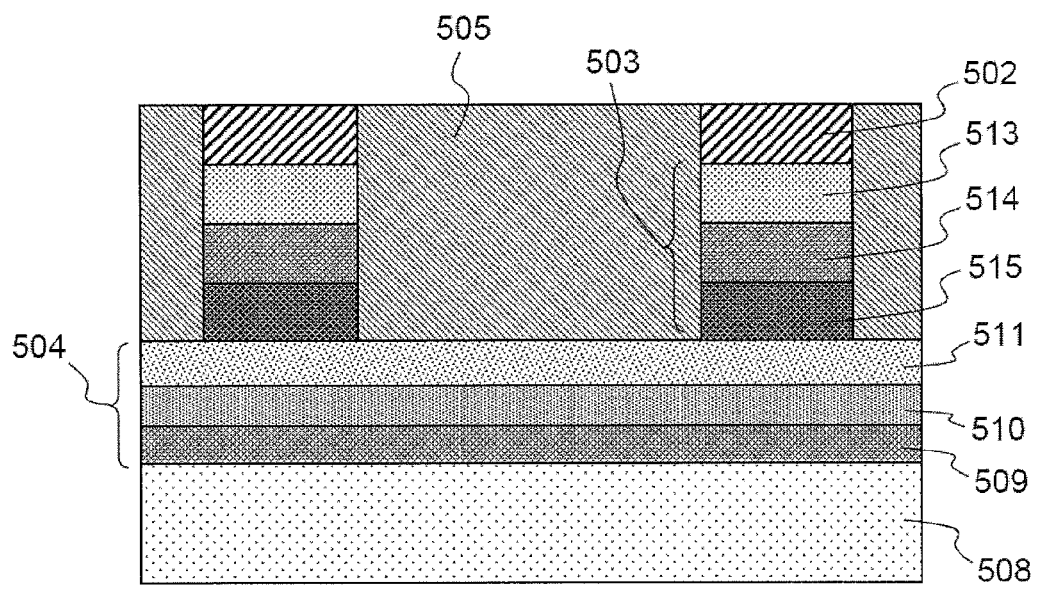
Figure 5F:
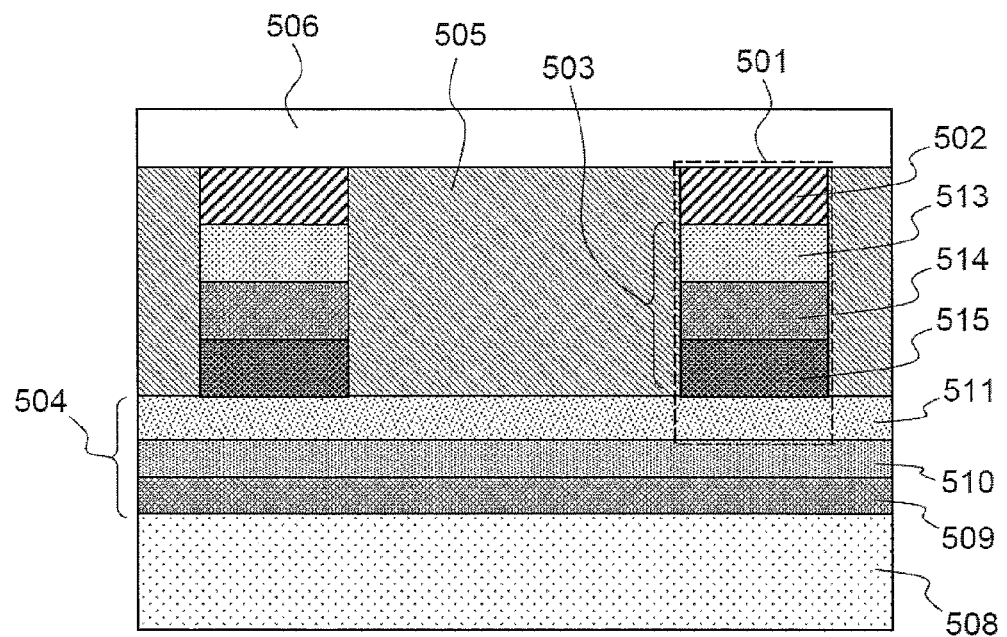
Figure 5G:
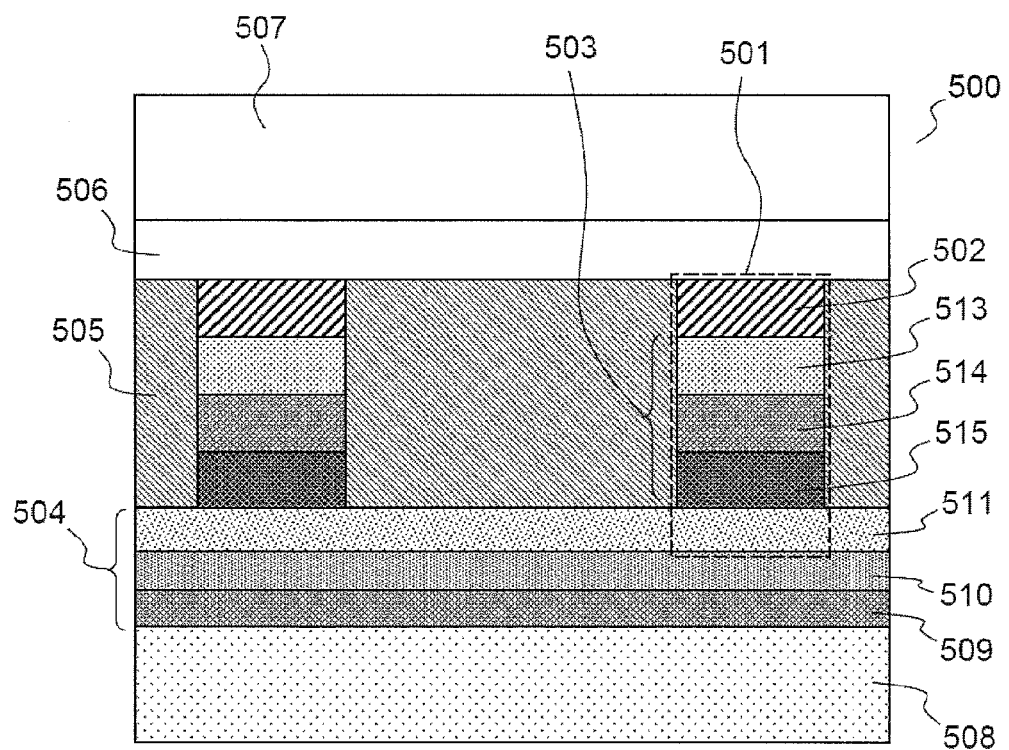

FIG. 4 shows an example of absorption and emission spectra for a spectral converter using the Lumogen RED 305® dye sold by BASF®. This figure shows the absorption curve 401 of the dye, the fluorescent emission curve 402, and the effective emission curve 403, which is furthermore the actual emission range of the dye because it takes into account self-absorption of the photons emitted by the dye.

In practice, the best material for the spectral conversion layer is a material having the widest possible absorption range (typically from 400 nm to the lowest emission wavelength) and a narrow emission spectrum that coincides with the resonance of the optical nano-antennae. By limiting non-radiative recombination losses in the spectral conversion material, a photoluminescence quantum yield (ratio of the number of photons emitted to the number of photons absorbed) of nearly 100% is advantageously achieved for the conversion material. Lastly, the best spectral conversion material is a material having a narrow spectral overlap region (wavelength region in which the converter can both emit and absorb, shown by the hatched region in FIG. 4) in order to limit self-absorption, which increases losses via non-radiative relaxation.

To form the spectral conversion layer 107 (FIG. 1), the material ensuring the spectral conversion (the "spectral converter") is, for example, hosted by a (liquid or solid) matrix. The matrix is transparent over the entire wavelength range corresponding to absorption and emission from the spectral converter. Moreover, the matrix chosen is one that enables uniform dispersion of the material in order to prevent it from aggregating, this aggregation degrading the optical performance of the elements in the aggregates, and one that does not modify the optical properties of the converters. In particular, the matrix chosen limits introduction of relaxation pathways that would lead to short non-radiative lifetimes. A wide variety of materials may be used for the matrix, the choice depending, apart from on the aforementioned conditions, on the nature of the spectral converter and on the thickness and refractive index desired for the spectral conversion layer.

The optimal thickness of the spectral conversion layer directly depends on dye concentration. The average free path of the photons in the spectral conversion layer depends on these two parameters i.e. thickness and concentration. The layer is advantageously optimized when almost all of the photons are absorbed by the dye while the losses due to the concentration of the dye (non-radiative relaxation, formation of aggregates and enhanced self-absorption) and to reflection from the bottom plane of the concentrator (the nano-antennae being reflective at wavelengths other than their resonant wavelength) are kept to a low level. For thicknesses of the order of a micron, the material used for the matrix may, for example, be the resist EPON™ SU-8 (HEXION™) or nano-structured ZnO. For millimetre-sized thicknesses, organic polymers (polymethyl methacrylate (PMMA), polydimethylsiloxane (PDMS), polyurethane, ethyl vinyl acetate (EVA), for example) deposited by moulding and inorganic matrices (zinc oxide (ZnO), tin oxide ($SnO_2$), aluminium oxide ($Al_2O_3$), etc.) may be used.

FIGS. 5A to 5G illustrate one way of manufacturing a photovoltaic component according to the present description, suitable, for example, for single-crystal semiconductor layers.

In a first step (FIG. 5A), a multilayer 503 of layers 513, 514, 515 made of a semiconductor (for example of InP) is grown by epitaxy on a suitable substrate 518 (for example one made of InP). A stop layer 519 (for example made of InGaAs) is also grown epitaxially between the substrate and the multilayer 503. The layers 513, 514, 515 are adapted to the production of the desired photovoltaic device. They are for example layers of n-doped, intrinsic and p-doped InP, respectively, in order to form a p-i-n junction. In a second step (FIG. 5B), the multilayer 503 is then transferred to a carrier substrate 508 (for example one made of Pyrex®). This operation is carried out in two phases. First the Pyrex® substrate is anodically bonded to metal layers (multilayer 504 of metal layers 509, 510, 511, for example aluminium, titanium and gold, respectively) deposited on the layer 515, then the substrate 518 is removed by selective chemical etching of the latter, this chemical etching being selective over the stop layer 519. The stop layer 519 is then selectively etched, this etching being selective over the active layer 513. In a third step (FIG. 5C), a structured metal layer 502, for example made of gold, is produced by lithography then lift-off or by nano-printing. In a fourth step (FIG. 5D), self-aligned etching of the multi-layer of semiconductor layers 503 is then carried out allowing pads 501 to be formed. As a variant, this etching may not be complete and it may leave all or part of the layers 514 and 515 intact. In a fifth step (FIG. 5E), after the etched sidewalls have optionally been passivated, an insulating and transparent encapsulation layer 505 (for example made of ZnO), is then deposited, then an upper contact layer 506 made of a transparent conductive material, for example of aluminium-doped ZnO, is deposited (FIG. 5F), this contact layer 506 making electrical contact with the metal pads 502. Lastly, the spectral conversion layer 507 is deposited on the structure (FIG. 5G), this spectral conversion layer 507 forming the front side of the photovoltaic device 500, which side is intended to receive the incident solar flux.

The epitaxially grown then transferred layers of single-crystal semiconductor such as described in the above process they for example comprise layers of gallium arsenide (GaAs) and associated alloys (for example aluminium gallium arsenide AlGaAs), layers of indium phosphide InP and associated alloys (for example indium gallium arsenide InGaAs), layers of gallium antimonide (GaSb) and associated alloys (for example aluminium gallium antimonide AlGaSb), and layers of silicon (Si).

As a variant, it is possible for the semiconductor layers to be locally deposited by plasma deposition, evaporation or electrodeposition. Semiconductor layers that may be locally deposited include, for example, copper indium gallium selenium (CIGS) or copper zinc tin sulphur (CZTS) alloy layers (by coevaporation or electrodeposition), and silicon layers (amorphous, microcrystalline or polycrystalline Si) that may be deposited by plasma deposition. In this case, the process for manufacturing a photovoltaic component according to the invention may comprise depositing (plasma deposition, evaporation, electrodeposition, etc.) the multilayer of layers made of conductive materials adapted to faun the desired photovoltaic device on a metalized substrate, producing a structured metal layer (lithography then lift-off), self-aligned etching of the semiconductor layer, depositing a transparent insulating encapsulation layer, and depositing an upper contact layer made of a transparent conductive material, for example ZnO.

In the case of layers made of organic semiconductors (for example poly(3-hexylthiophene) (P3HT) and methyl[6,6]-phenyl-C61-butyrate] (PCBM)) or hybrid semiconductors (for example CdSe and P3HT), a similar process to that described with reference to layers of polycrystalline semiconductor may be employed, but the deposition will possibly be carried out by spin coating or by means of a doctor blade®.

In all of the example manufacturing processes described, materials with high production costs may be recovered during etching of the semiconductor layer.

The examples described above were limited, for the sake of clarity, to the case of a single spectral converter associated with a single array of similar nano-cells. This process may be generalized to the case where one or more dyes are associated with one or more types of nano-cells, as will be described in more detail below.

In order to illustrate the benefit provided by a photovoltaic component of the type presented in the present description, Monte Carlo simulations of the performance of three systems were carried out. The first two systems are systems described in the prior art and they are schematically shown in FIG. 6A, the third system is an example of a photovoltaic component according to the present description, and it is schematically shown in FIG. 6B.

Figure 6A:
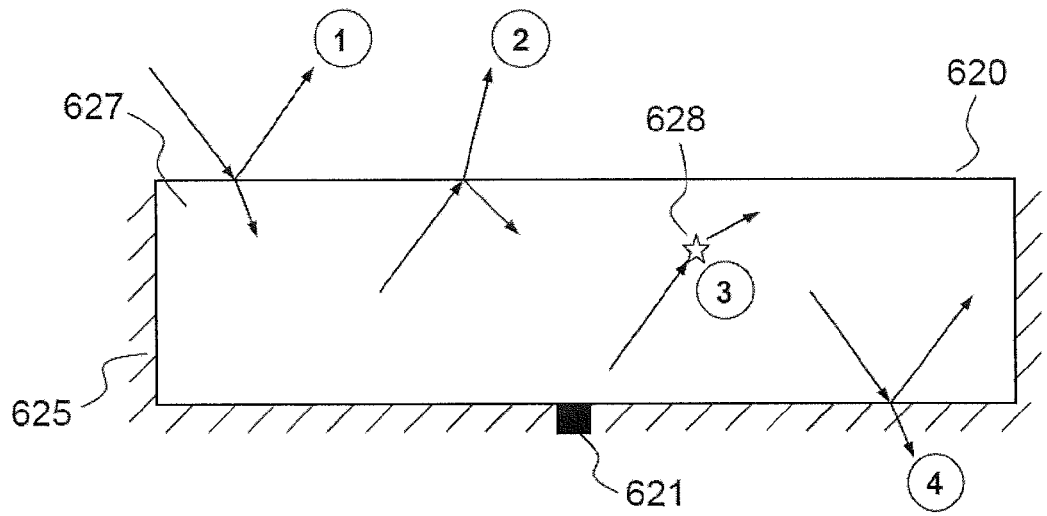
FIGS. 6A and 6B, schematics illustrating losses of useful light energy in a prior-art system and in a system according to the present description, respectively.
Figure 6B:
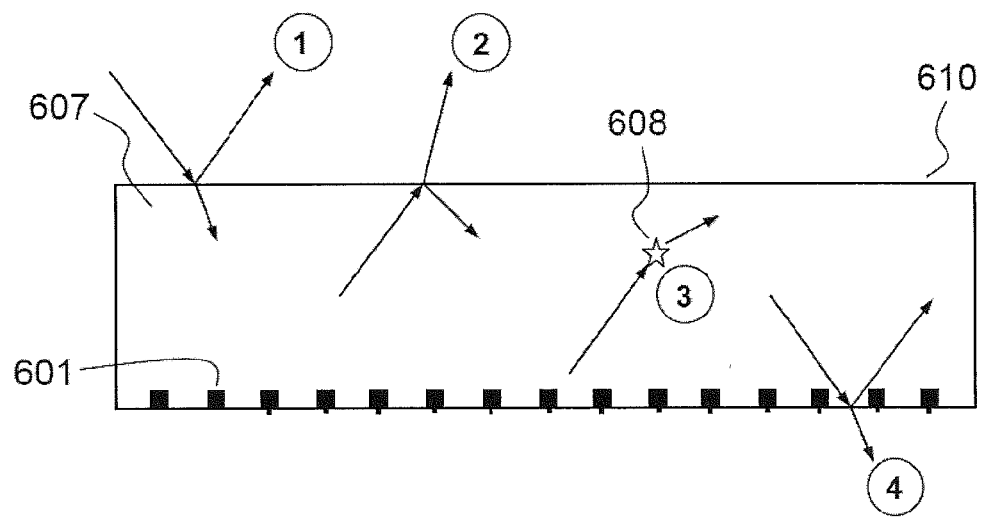

The first system, shown in FIG. 6A, is a standard luminescent solar concentrator (LSC). It comprises an organic polymer layer 627 containing fluorescent molecules 628. The front side 620 is the side that is intended to receive the incident solar flux. A silver reflector 625 is arranged on the back side (side opposite the side receiving the incident solar flux). A photovoltaic cell 621 is inserted in this reflector a small part of which it covered, thus defining the geometric concentration ratio of the system: ratio of the area illuminated by the incident flux to that of the cell.

The second system considered is comparable to the first system but comprises a (photonic band-stop (PBS)) filter arranged on the front side (not shown in FIG. 6A). The PBS filter is here simulated via total reflection (R=1) for wavelengths longer than 620 nm and perfect transmission (T=1) therebelow. The cut-off wavelength of 620 nm is the value for which the number of photons (i.e. of wavelength shorter than 620 nm) absorbed by the photovoltaic cell is maximal.

The third system (FIG. 6B) is an example of a photovoltaic component according to the present description. It comprises an array of photovoltaic nano-cells 601 arranged on the back side of a spectral conversion layer 607 comprising a spectral conversion material 608 allowing at least some of the solar spectrum to be converted to the resonant spectral band of the optical nano-antennae present in each of the nano-cells. The front side intended to receive the solar flux is referenced 610.

Where possible, in order to make comparison easier, parameters were kept the same from one system to another. Thus, for the simulations, the following situations were considered. The three systems comprise a 5 mm-thick organic polymer layer (607, 627) with a refractive index of 1.75. The polymer layer contains fluorescent molecules of the dye Lumogen RED 305® the absorption and emission spectra of which are shown in FIG. 4. The concentration is set to 270 ppm (parts per million); it is comparable to that reported in the literature, and corresponds to almost total absorption (99%), for a round trip through this layer, of photons having, in the absorption spectral range, the lowest absorption probability (i.e. 470 nm, see FIG. 4). The photoluminescence quantum yield (PLQY) is set to 0.95. This corresponds to the minimum value guaranteed by the manufacturer. The photovoltaic cells are produced with a semiconductor material having a band-gap energy $E_g$=1.77 eV, i.e. a cut-off wavelength of 700 nm.

The two first systems moreover have, on their back side, a mirror of reflectivity R=0.98 and a cell covering 2% of the input area of the system, i.e. a geometric concentration ratio of 50.

The third system, corresponding to the photovoltaic component according to the present description, has, on its back side, an array of photovoltaic nano-cells such that, at resonance, the back side behaves as a perfectly absorbing surface. The absorption spectrum of the nano-cells is simulated by a Lorentzian function centred on 665 nm with a full width at half-maximum FWHM=133 nm, i.e. a quality factor Q=5. Absorption losses in the metal are set to 5% of the total absorption. The sum of the areas of these nano-cells is equal to 2% of the input area of the system, i.e. a geometric concentration ratio of 50, equal to that of the first two systems.

Table 1 below shows the distribution of the losses calculated for the three systems studied and the amount of photons absorbed by the cells. The various causes of the losses, schematically shown in FIGS. 6A and 6B, are indicated in these figures by the numbers 1 to 4. The "input losses" (numbered 1) are Fresnel losses related to reflection of incident photons from the air/PMMA input dioptre of the system. The "front side losses" (numbered 2) are losses related to transmission of photons from the spectral conversion layer through the PMMA/air dioptre of the front side. The "non-radiative losses" (numbered 3) are losses related to non-radiative relaxation of the excited dye molecules (i.e. the difference between the actual photoluminescence quantum yield of the dye and its ideal photoluminescence quantum yield). The "back side losses" (numbered 4) are losses of photons at the back side due to absorption in the metal there: that of the non-ideal mirror (R=0.98) in the two first systems and that of the MIM nano-resonators (5% of the total absorption) in the case of the third system. The "photons (lambda>700 nm)" losses are losses due to the dye emitting photons at energies that are too low for them to be absorbed by the absorbing semiconductor of the photovoltaic cells.

Table 1 also shows the "amount of photons absorbed" by the photovoltaic cell 621 in the case of the first two systems, and by the array of nano-cells 601 in the case of the photovoltaic component according to the present description.

TABLE 1

Distribution of the losses calculated for the three systems studied and the amount of photons absorbed by the photovoltaic device.

| | Input losses | Front side losses | Non-radiative losses | Back side losses | Amount of photons absorbed | Photons (lambda > 700 nm) |
|---|---|---|---|---|---|---|
| System 1 conventional LSC without PBS | 7.4% | 48.4% | 12.8% | 15.4% | 13.5% | 2.8% |
| System 2 conventional LSC with PBS | 36.9% | 7.1% | 13.9% | 20.9% | 19.0% | 2.2% |
| System 3 PV component according to the invention | 7.4% | 11.5% | 7.3% | 3.7% | 66.9% | 3.2% |

The refractive index (n=1.75) chosen for the polymer corresponded to the air/polymer-dioptre design providing the best compromise for trapping photons in the spectral conversion layer mainly made of this polymer. Specifically, "input losses" increase in proportion to refractive index whereas "back side losses" increased in inverse proportion to refractive index. However, it will be noted that this optimum is not very marked and that using a conventional polymer such as PMMA (n=1.49) introduced an additional loss of less than 1%.

The main limitation (48.4%) of the LSC system without a PBS filter (system 1) is due to "front side losses" caused by photons in the spectral conversion layer being incompletely reflected by this dioptre. Specifically this reflection is total (total internal reflection) when the angle of incidence is larger than a limiting angle (here 36 degrees) but very small (on average less than 10%) below this angle. Since the photons have an isotropic distribution after they are emitted by the dye, a large loss is incurred (L=15%) in the first reflection following emission by the dye. The following reflections, until the next dye absorption/emission event, will be total reflections since all the photons have angles larger than the critical angle (selection achieved via the first reflection). Furthermore, as the cell only covers 2% of the front side (geometric concentration ratio equal to 50), the photons must make a number of round trips between the front and back sides of the spectral conversion layer before being absorbed by the semiconductor or lost to one of the processes in Table 1. The simulation counted, for each photon collected by the semiconductor, an average of 18.5 reflections from each of the two sides and 3.8 absorptions by the dye. A loss L=15% in each first reflection gives a probability of loss via the front side of $1-(1-L)^{3.8}=46\%$ in good agreement with the results of the simulation.

In order to decrease the effect of this limitation, a front-side PBS filter (system 2) may be used to allow short wavelength photons (mainly the incident photons) to pass while reflecting those with longer wavelengths (mainly photons emitted by the dye). It is hoped in this way to change the spectral offset between absorption and emission in order to improve trapping of photons in the conversion layer. The results of the simulation show a certain improvement in the amount of photons absorbed by the semiconductor (19% instead of 13.5% in the preceding system) but in too small a degree to provide an efficient system. The limited effect of the PBS filter is mainly due to two effects: on the one hand, rejection of incident photons with wavelengths that are too long (a loss of 36.9% on the input side), and on the other hand, an excess number of round trips in the cavity increasing intrinsic losses (20.9% on the back-side mirror, 14% in the dye). Specifically, the simulation counted an average of 21.6 reflections from each of the two sides (instead of 18.5 in system 1) and 4.5 absorptions by the dye (instead of 3.8 for system 1).

Thus, the first system (LSC without PBS) has a low efficiency because the trapping of photons in the conversion layer is not effective enough, they escape (front side losses) before being absorbed by the semiconductor. Trapping is improved in the second system (LSC with PBS), but its performance is limited by losses intrinsic to the elements of the system (filter, mirror, absorption) and improving the trapping increasing these losses.

The performance of the system according to the present invention is greatly improved relative to prior-art systems because the nano-cells make a high geometric concentration ratio (here 50) compatible with almost-perfect absorption of the photons emitted by the dye. This results in s drastic increase in the amount of photons absorbed by the semiconductor (66.9%). This also results in a large decrease in the number of return trips the photons make between the two sides of the system. Specifically, the simulation counted an average of 0.6 reflections from the front side, 0.3 reflections from the back side, and 1.8 absorptions by the dye, explaining the lower front side losses ($1-0.85^{0.6}=9.3\%$ similar to the 11.7% shown in Table 1), back side losses (5% of the total absorption, i.e. 3.1%, similar to the 3.3% shown in Table 1) and losses during absorptions/emissions ($1-PLQY^{1.8}=8.8\%$, similar to the 8.4% shown in Table 1).

Figure 7A:
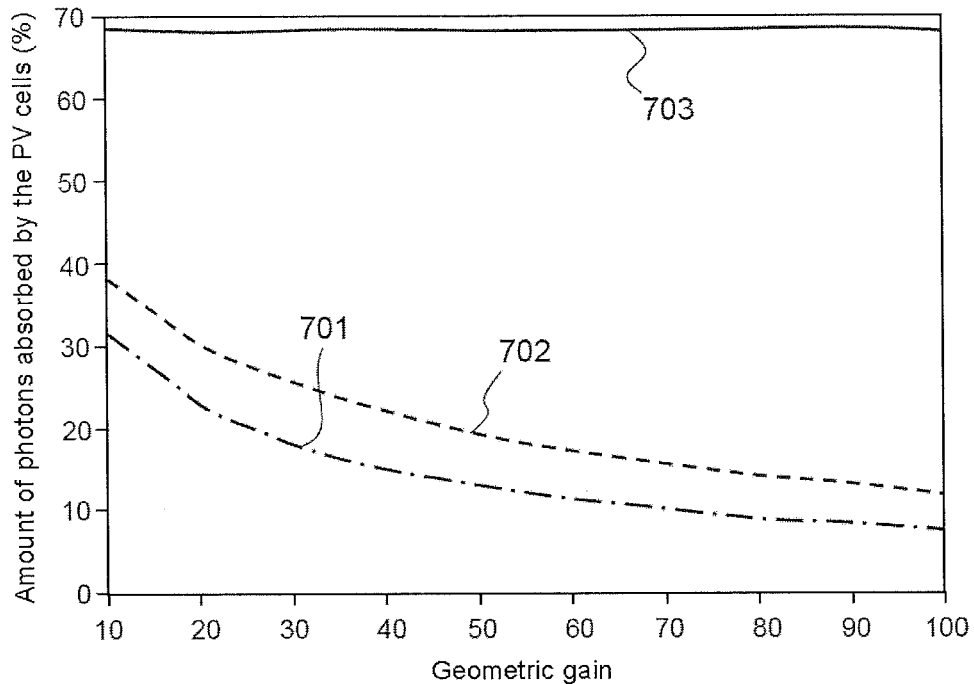
FIGS. 7A to 7C, curves showing the amount of photons absorbed by the photovoltaic cells as a function of the geometric gain, the photoluminescence quantum yield of the dye, and of the quality factor of the MIM nano-antennae, respectively, in systems according to the prior art and according to the present invention.

The photovoltaic component according to the present description thus allows very high geometric concentration ratios to be achieved. Specifically, the geometric concentration ratio is, for a nano-cell, the ratio of its effective capture cross section (typically $\lambda^2$) to the physical cross section of the nano-diode. It is therefore possible to envision geometric concentration ratios of about 100. Advantageously, the nano-cells may be placed on the back side of the concentrator in a way such that their effective capture cross sections completely pave this back side. At resonance, the back side therefore exhibits almost perfect absorption (i.e. nearly 100%). As a result, as may be seen in FIG. 7A, the efficiency with which photons are collected by the nano-cells is independent of geometric concentration ratio (curve 703). This is not at all the case for the prior-art systems (curves 701 and 702) in which increasing the geometric concentration ratio increases the number of photon round trips in the conversion layer which, as was demonstrated above, increases losses and decreases the amount of photons absorbed by the semiconductor.

Figure 7B:
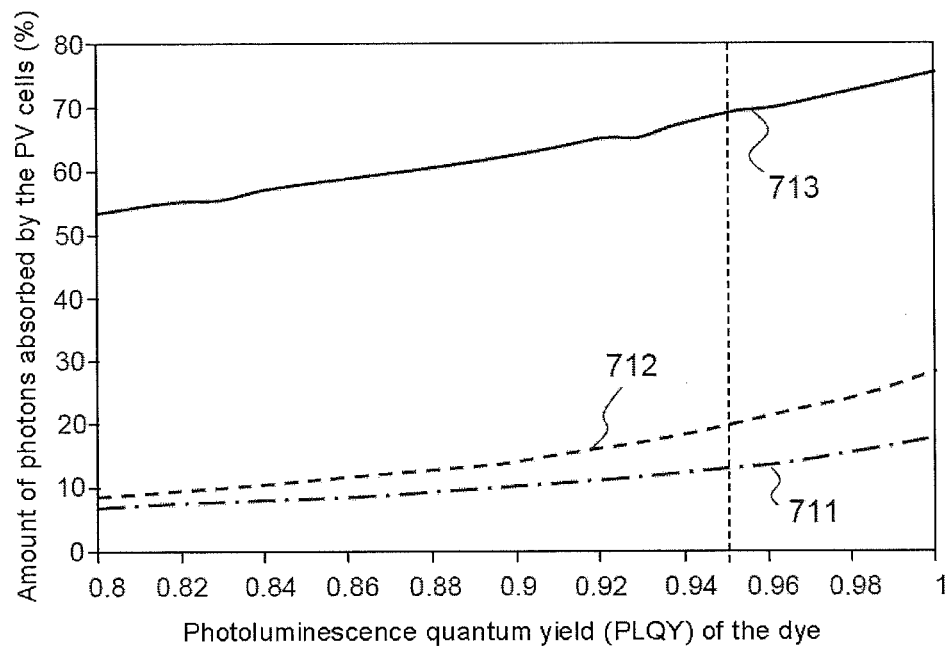

Furthermore, reducing the number of absorptions by the dye leads to the performance of the system (i.e. the amount of photons absorbed by the semiconductor) being less dependent than the prior-art systems on the photoluminescence quantum yield of the dye. To illustrate this effect, the amount of photons absorbed by the photovoltaic device is shown in FIG. 7B as a function of the photoluminescence quantum yield (PLQY) of the dye. It will be noted that using a dye of yield PLQY=0.95 leads to a relative reduction in the amount of photons absorbed relative to the ideal case (PLQY=1) of 21.6% for the LSC system without PBS (curve 711), of 22.7% for the system with PBS (curve 712) and of only 9.1% in the case of the invention (curve 713). This lower dependence introduces greater flexibility into the design of the system of the invention as it will possibly be preferable, for example, to select a dye on the basis of the suitability of its spectral response, to the detriment of its photoluminescence quantum yield.

Figure 7C:
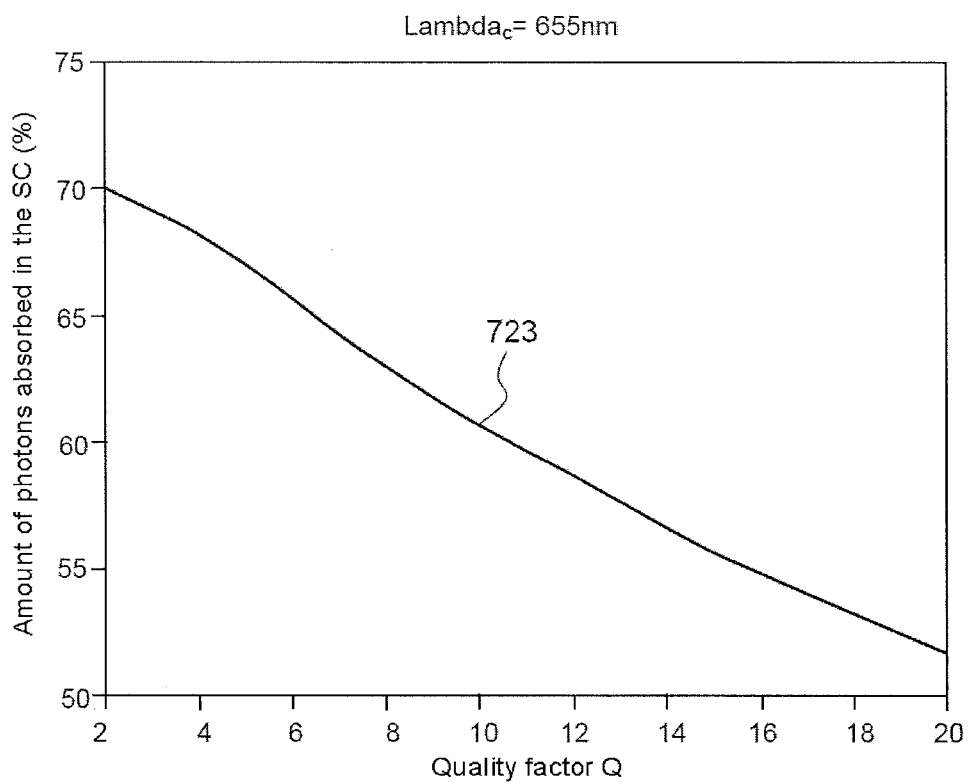

The resonant character of the absorption of the nano-cells means that, on the one hand, there must be a good accordance between this resonance and the emission of the dye, and that, on the other hand, the resonance must be wide enough to efficiently absorb the photons emitted by the dye. The first point is easily addressed by finding the resonant wavelength at which the maximum number of photons are absorbed by the semiconductor. It was this method that was used in the above example to place the resonance at $\lambda=665$ nm. In order to evaluate the effect of the second point (width of the resonance) the amount of photons absorbed in the semiconductor is plotted (FIG. 7C) as a function of the quality factor Q of the nano-resonators. It will be observed that the amount of photons absorbed increases in inverse proportion to the quality factor, i.e. in proportion to the width of the resonant peak. High amounts of absorption will therefore be obtained with low-quality-factor resonators, in the above example Q=5. It is also possible, in the same period of the nano-antenna paving, for a number of cells that are slightly offset in wavelength to be juxtaposed in order to obtain a spectral width matched to the emission of the chosen dye.

The above examples thus describe various embodiments of the photovoltaic component according to the invention, associating various types of photovoltaic conversion materials and/or various types of optical nano-antennae.

More precisely, the spectral conversion layer may comprise a number of types of absorbent/emissive materials (dyes, quantum dots, etc.) in order to better cover all of the solar spectrum. Various approaches are then possible, these approaches being called "cascade mode" (which implements N dyes and one type of nano-cell), "parallel mode" (which implements N dyes and N types of nano-cell) and "hybrid mode" in the rest of the description.

Figure 8:
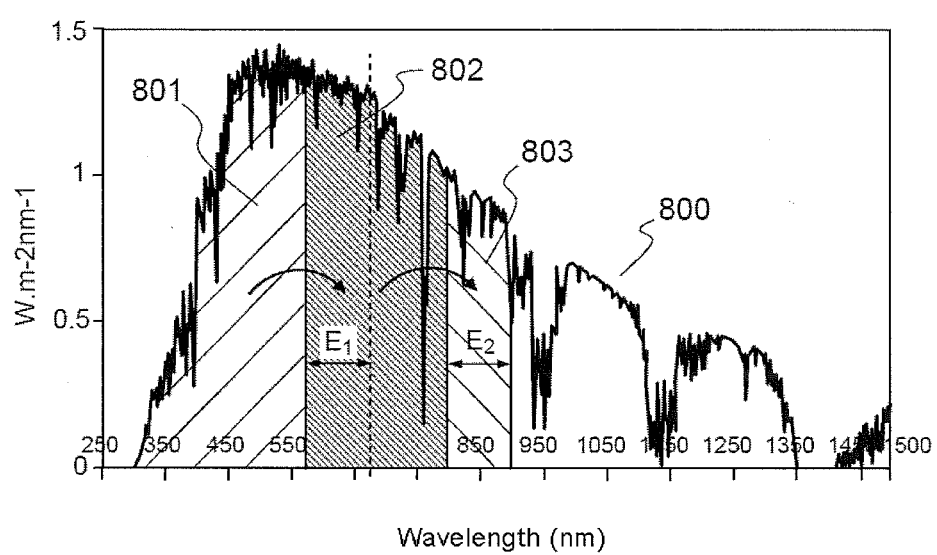
FIG. 8, a curve showing the solar spectrum, examples of spectral absorption and emission bands of two spectral conversion materials in a "cascade" mode being indicated on this curve.
Figure 9A:
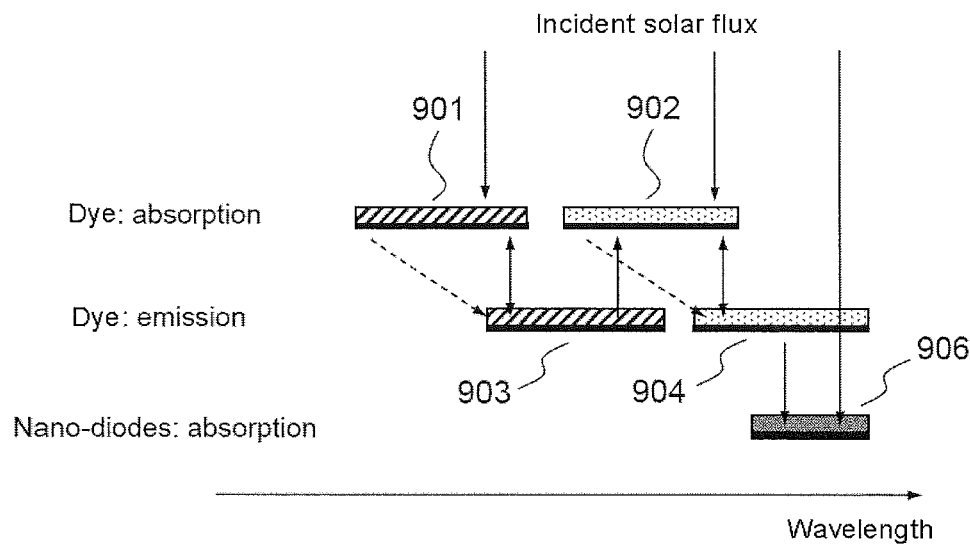
FIGS. 9A to 9C, schematics illustrating the absorption and emission of two spectral conversion materials as a function of wavelength, and the absorption of an electromagnetic resonator, in a "cascade" mode, in a "parallel" mode, and in a "hybrid" mode, respectively.
Figure 9B:
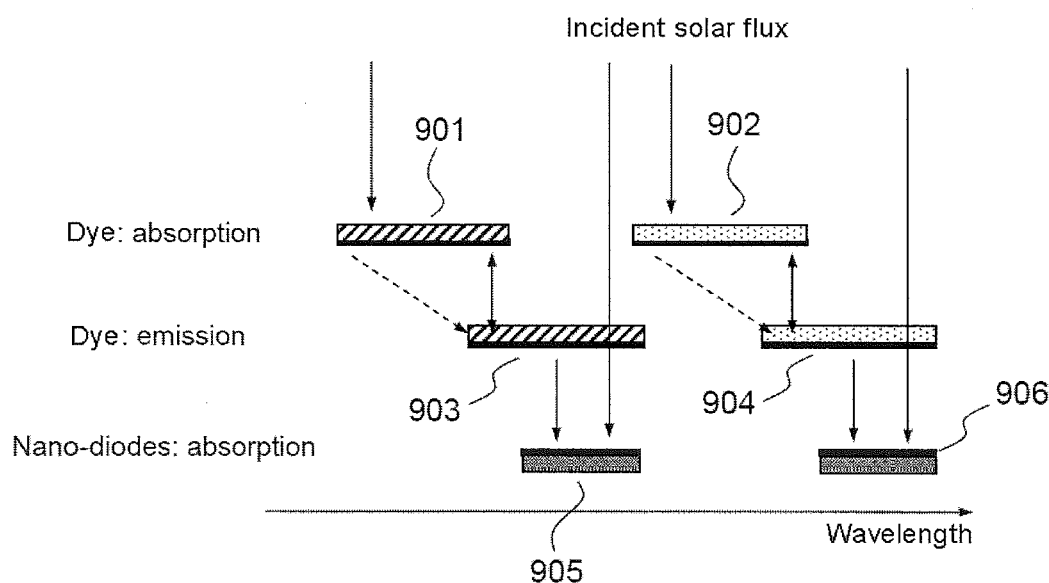
Figure 9C:
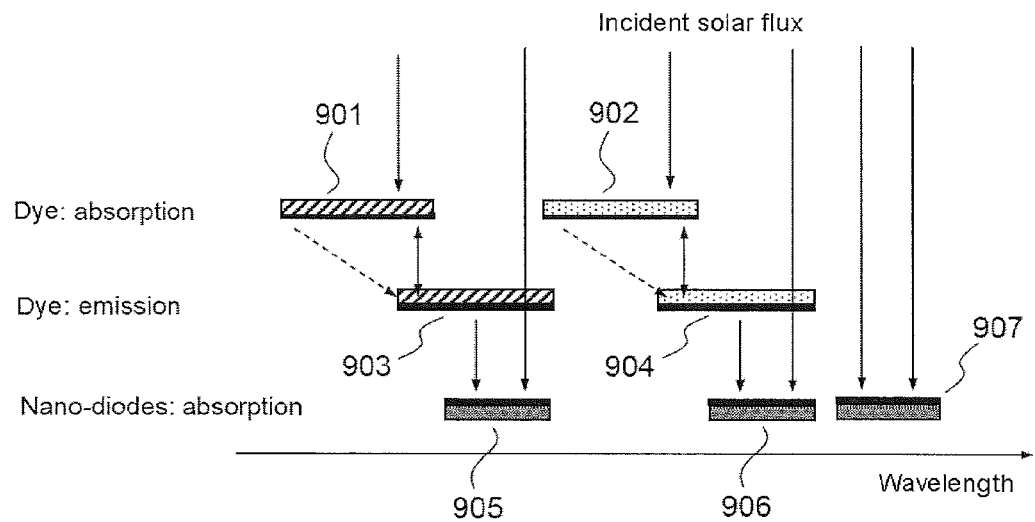

FIGS. 8 and 9A illustrate a first operating mode called the "cascade" mode. Shorter wavelength photons are absorbed by a first spectral converter or dye (absorption spectrum symbolized by the strip 901 in FIG. 9A) the absorption range of which is indicated by the hatched range 801 in FIG. 8, then re-emitted (emission spectrum 903) at a longer wavelength (emission band indicated by the arrow $E_1$ in FIG. 8). In FIGS. 9A, 9B and 9C, the dotted arrows represent the energy flux associated with internal spectral conversion inside the dyes and the solid arrows represent the radiative flux between molecules of the dye or towards a nano-cell. These photons are then absorbed by a second spectral converter (absorption spectrum 902 in FIG. 9A) chosen so that its absorption band (hatched zone 802 in FIG. 8) covers the emission band $E_1$ of the first spectral converter, then re-emitted (emission spectrum 904) at an again longer wavelength (emission band indicated by the arrow $E_2$). It is thus possible to cover the solar spectrum with one set of different spectral converters. The absorption range of the spectral conversion of rank i (i increasing for dyes covering ranges of longer wavelengths) must at least partially cover the emission range of the spectral converter of rank i−1. The optical nano-antennae and the photovoltaic device that they contain are then matched to the emission wavelength of the last spectral converter, the latter emitting in the wavelength range containing the longest wavelengths. The photons thus undergo an absorption/relaxation/emission cascade from their initial absorption by the first spectral converter until absorption by one of the nano-cells (absorption spectrum 906 in FIG. 9A). This approach allows the entire solar spectrum to be covered with only a single type of nano-cells. The latter will therefore possibly be, as described above, optimized to absorb photons at the resonant length. However, the wavelength conversion produced by each dye, between absorption and emission of a photon, involves a loss of energy, which energy is dissipated in the form of heat (mechanism for the relaxation mentioned above). This may result in a loss being introduced into the electrical conversion process (for example, a 330 nm photon converted into a 1000 nm photon will have lost ⅔ of its energy before being converted into electrical energy for a voltage of about 1V across the terminals of a GaAs junction) and heating of the dye may result in premature ageing of the latter. It will be noted that this loss of energy in the conversion process is identical to that observed in conventional solar cells and results in a maximum conversion efficiency of 32% for a single junction cell.

FIG. 9B illustrates the parallel mode. In this mode, a number of types of nano-antennae are associated with a corresponding number of types of spectral converters. Specifically, it is possible to provide a number of different nano-antennae, for example of the MIM type, and to maintain almost total absorption for each resonance associated with each type of nano-antennae. Engineering the spectral response of this assembly allows, in the case of the invention, a perfectly absorbent plane to be produced over an array of spectral ranges. Each spectral converter/nano-cell group therefore allows, in an optimized configuration, almost total absorption in the spectral range corresponding to the combination of the absorption and emission spectral ranges of the spectral converter. Incident photons in the absorption range of each spectral converter are absorbed (absorption spectra 901, 902) by the latter then re-emitted (emission spectra 903, 904) in the emission range before being absorbed by the associated nano-cell (absorption spectra 905, 906). Furthermore, incident photons in the absorption range of the nano-cell are directly absorbed by the latter. The nano-antennae are loaded by multilayers of semiconductor layers the bandgap energy of which is matched to the resonant wavelength of the antenna. Thus, an electrical converter that provides a perfect match to the emission of each spectral converter is obtained. The photons emitted by a spectral converter are absorbed by the nano-antennae matched to this wavelength. They are then converted, with a clearly smaller energy loss than was the case above (a photon of 330 nm will possibly, for example, be converted into electrical energy with greater than 90% efficiency for a voltage of more than 3 V across the terminals of a ZnO junction). The solar spectrum will best be covered by assembling spectral converter/nano-cell groups as required basis. It will in particular be possible to ensure total coverage of spectral regions containing bright solar radiation (typically between 450 and 750 nm) and to leave ranges of zero absorption between these groups in spectral zones where solar radiation at sea level is particularly dim, for example in the vicinity of the wavelengths 940 nm and 1120 nm (see for example the spectrum 800 in FIG. 8).

FIG. 9C illustrates the case of the hybrid mode. In this operating mode nano-cells of various types are associated, respectively, with spectral converters, as was described for the parallel operating mode. Other types of nano-cells, which are not associated with a spectral converter, are inserted and enable direct absorption (absorption spectrum 907).

Figure 10:
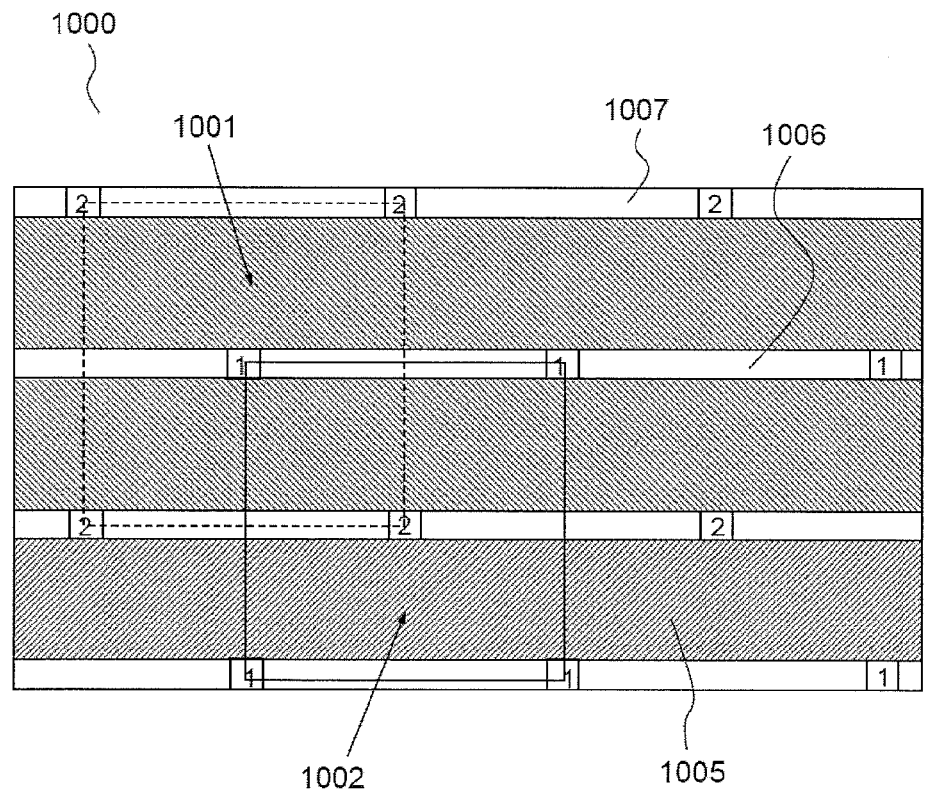
FIG. 10, a schematic illustrating an example electrical connection for photovoltaic nano-cells operating with a spectral conversion layer in a parallel or hybrid mode.

In the parallel or hybrid operating modes, it is recommended to electrically connect all of the nano-cells of a given type. An example layout is illustrated in FIG. 10 for two types of nano-cells, types "1" and "2". The lower metal plane (not shown in the figure) is used as a common electrode, and networks of electrical lines 1006, 1007 connect the upper parts of the nano-antennae of the same type, 1 and 2, respectively. These electrical lines will advantageously be produced by structuring the aluminium-doped ZnO layer (referenced 506 in FIG. 5G) deposited on the encapsulation layer 1005 (layer 505 in FIG. 5E), which is for example made of ZnO, see the manufacturing process described above. The squares 1001, 1002, represent the effective absorption cross section of the nano-antennae "1" and "2" placed at their centre, respectively. Paving, using these effective cross sections, of the entire lower plane of the photovoltaic component of the invention ensures, at resonance, almost total absorption of the incident photons by the nano-cells corresponding to this resonance. This paving will possibly be periodic. The maximum theoretical conversion efficiency of this multi junction system is no longer limited to 32% as was the case above. It is strongly dependent on the number of types of nano-cells used. For an infinite number of the latter it is 86.8% under direct illumination. For nano-antennae with a lateral dimension of about $\lambda/10$, placed in a periodic arrangement of period $\lambda/2$, it is feasible to use three, even four, types of different nano-cells. For four types of cells, the optimal efficiency under direct illumination is 68.8%, i.e. more than two times that for a single junction.

Generally, it is possible to conceive of systems combining, depending on the spectral ranges in question, "cascade" and "parallel" modes. In particular it will be possible to insert one or more types of nano-cells that will not be associated with a dye.

Although described by way of a number of detailed embodiments, the photovoltaic component and the method for manufacturing said component include various variants, modifications and improvements that will appear obvious to those skilled in the art.

In particular, the optical nano-antennae may be loaded with a multilayer other than one forming a p-n junction. In fact, any photovoltaic structure is acceptable provided that its thickness allows, via the nano-antenna, a resonance matched to the emission wavelength of the dye to be obtained. Moreover, although the description was given with respect to MIM resonators, it may be envisioned to use other electromagnetic resonators that also provide an optical nano-antenna function for spatial concentration of the solar flux.

The invention claimed is:

1. A photovoltaic component comprising:
   at least one first array of photovoltaic nano-cells each comprising an optical nano-antenna exhibiting an electromagnetic resonance in a first resonant spectral band, at least one lateral dimension of the optical nano-antenna being smaller in size than a central wavelength of said first resonant spectral band; and
   a spectral conversion layer allowing at least part of the solar spectrum to be converted to said first resonant spectral band.

2. The photovoltaic component according to claim 1 comprising a continuous first metal layer, and in which each photovoltaic nano-cell comprises a structured multilayer of a first dielectric layer and of a second metal layer to form, with the continuous first metal layer, an optical nano-antenna of the MIM type at least one lateral dimension of which is smaller in size than a central wavelength of said first resonant spectral band.

3. The photovoltaic component according to claim 2, in which said dielectric layer comprises a multilayer of semiconductor layers, at least one layer of which is made of a semiconductor that is absorbent in said first resonant spectral band, and one layer or multilayer of which is made of a doped semiconductor ensuring electrical contact with the second metal layer.

4. The photovoltaic component according to claim 3, in which only the layer or multilayer made of the doped semiconductor ensuring the electrical contact with the second metal layer is structured.

5. The photovoltaic component according to claim 2, in which a lateral dimension of each optical MIM nano-antenna is smaller than $\lambda_0/5$ where $\lambda_0$ is a central wavelength of said first resonant spectral band.

6. The photovoltaic component according to claim 2, in which said optical MIM nano-antennae take a strip form and are placed with a principle orientation, and in which the second metal layers of at least some of the optical MIM nano-antennae are connected to form an upper electrical contact for the first array of photovoltaic nano-cells.

7. The photovoltaic component according to claim 6, in which the optical MIM nano-antennae take a strip form the width of which varies on a subwavelength scale.

8. The photovoltaic component according to claim 2, in which said optical MIM nano-antennae have a pad form and are placed in two principal directions, said component furthermore comprising an electrical insulator and transparent encapsulation layer between the pads, and a transparent conductive layer making contact with the second metal layers of at least some of the optical nano-antennae in order to form an upper electrical contact for the first array of photovoltaic nano-cells.

9. The photovoltaic component according to claim 1, in which the spectral conversion layer comprises one or more spectral conversion materials inserted in a solid or liquid matrix.

10. The photovoltaic component according to claim 1, in which said spectral conversion layer comprises at least two spectral conversion materials, the absorption spectrum of the second material covering the effective emission spectrum of the first material, and the effective emission spectrum of the second material being at least partially superposed with said first resonant spectral band.

11. The photovoltaic component according to claim 1, comprising at least one first array of photovoltaic nano-cells each comprising an optical nano-antenna having a first resonant spectral band, and a second array of photovoltaic nano-cells each comprising an optical nano-antenna having a second resonant spectral band.

12. The photovoltaic component according to claim 11, in which the spectral conversion layer comprises at least one spectral conversion material allowing at least part of the solar spectrum to be converted to the first and second resonant spectral bands.

13. The photovoltaic component according to claim 11, in which the spectral conversion layer comprises at least two spectral conversion materials, each of said spectral conversion materials allowing at least part of the solar spectrum to be converted to each of said first and second resonant spectral bands.

14. The photovoltaic component according to claim 1, furthermore comprising an array of photovoltaic nano-cells each comprising an optical nano-antenna the resonant spectral band of which is adapted for direct absorption of part of the solar spectrum.

15. A method for manufacturing a photovoltaic component according to claim 1, comprising:
   depositing, on a metallized substrate, a multilayer of semiconductor layers one layer of which is absorbent in said first resonant spectral band;
   depositing a structured metal layer;
   self-aligned etching of at least some of said semiconductor layers; and
   depositing an encapsulation layer and an upper contact layer made of a transparent conductive material.

16. The manufacturing method according to claim 15, in which the deposition step comprises growing by epitaxy on a suitable substrate said multilayer of semiconductor layers, and transferring said semiconductor layers to the metallized substrate.

* * * * *